United States Patent
Gong et al.

(10) Patent No.: US 9,960,749 B2
(45) Date of Patent: May 1, 2018

(54) INTRA-BAND COMBINER-DIVIDER AND MULTISYSTEM COMBINING PLATFORM

(71) Applicant: HUAWEI TECHNOLOGIES CO., LTD., Shenzhen (CN)

(72) Inventors: Lanping Gong, Shenzhen (CN); Zhen Yuan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days. days.

(21) Appl. No.: 15/165,299

(22) Filed: May 26, 2016

(65) Prior Publication Data

US 2016/0268993 A1 Sep. 15, 2016

Related U.S. Application Data

(63) Continuation of application No. PCT/CN2013/087942, filed on Nov. 27, 2013.

(51) Int. Cl.
*H03H 7/48* (2006.01)
*H03H 7/46* (2006.01)
*H03H 11/36* (2006.01)

(52) U.S. Cl.
CPC .............. *H03H 7/463* (2013.01); *H03H 7/48* (2013.01); *H03H 11/36* (2013.01)

(58) Field of Classification Search
CPC ........... H03H 7/463; H03H 7/48; H03H 11/36
USPC ......................................................... 333/132
See application file for complete search history.

(56) References Cited

U.S. PATENT DOCUMENTS

| | | | |
|---|---|---|---|
| 9,100,082 B2 * | 8/2015 | Shida | H04B 7/155 |
| 2005/0136875 A1 | 6/2005 | Skarby et al. | |
| 2006/0003808 A1 | 1/2006 | Haskell et al. | |
| 2008/0212500 A1 | 9/2008 | Zhen et al. | |
| 2008/0212502 A1 | 9/2008 | Zhen et al. | |
| 2011/0051628 A1 | 3/2011 | Cohen et al. | |
| 2011/0188413 A1 | 8/2011 | Kuo et al. | |

FOREIGN PATENT DOCUMENTS

| | | |
|---|---|---|
| CN | 101282153 A | 10/2008 |
| CN | 101316131 A | 12/2008 |
| CN | 102546035 A | 7/2012 |

OTHER PUBLICATIONS

International Search report dated Jul. 15, 2014 in corresponding International Application No. PCT/CN2013/087942.

(Continued)

*Primary Examiner* — Robert J Pascal
*Assistant Examiner* — Kimberly Glenn
(74) *Attorney, Agent, or Firm* — Kilpatrick Townsend & Stockton LLP

(57) ABSTRACT

Embodiments of the present application provide an intra-band combiner-divider and a multisystem combining platform, and the intra-band combiner-divider includes: a first-level duplexer, an intra-band combination unit, an intra-band division unit, and a second-level duplexer. In the embodiments of the present application, two ends of the intra-band combiner-divider are connected to the first-level duplexer and the second-level duplexer, so that the intra-band combiner-divider can separately process uplink and downlink signals, thereby reducing PIM of a communication system and improving receiver sensitivity of a base station.

12 Claims, 5 Drawing Sheets

(56) References Cited

OTHER PUBLICATIONS

Office Action dated Jul. 28, 2016 in the corresponding Chinese application (Application No. 201380076230.X), and the Search Report.
Supplementary Partial European Search Report dated Oct. 26, 2016 in the corresponding European Application (Application No. 13898412.5).
Search Report dated Jul. 5, 2014 in the corresponding PCT Application No. PCT/CN2013087942.

* cited by examiner

INTRA-BAND COMBINER-DIVIDER AND MULTISYSTEM COMBINING PLATFORM

CROSS-REFERENCE TO RELATED APPLICATIONS

This application is a continuation of International Application No. PCT/CN2013/087942, filed on Nov. 27, 2013, which is hereby incorporated by reference in its entirety.

TECHNICAL FIELD

Embodiments of the present application relate to the field of wireless communications, and in particular, to an intra-band combiner-divider and a multisystem combining platform.

BACKGROUND

A building usually has a strong shielding effect on a signal. In an indoor environment such as a shopping mall or an underground parking lot, a communication signal is usually weak, which severely affects normal use of a mobile phone.

Based on the foregoing reason, indoor extension coverage of a base station becomes increasingly important. Various signals that are in different bands and of different operators exist in an indoor area; therefore, in order to prevent repeated investment, currently a multisystem combining platform, also referred to as a point of interface (POI), is put forward. The multisystem combining platform is installed in an indoor area, and can combine different system signals received from an external environment and send combined signals to an indoor mobile terminal.

However, a communication system using a traditional multisystem combining platform has high passive intermodulation (PIM) and poor intra-band isolation; in a scenario in which there are multiple operators and multiple bands and power is high, high PIM easily causes a second-order intermodulation product and a third-order intermodulation product, thereby affecting receiver sensitivity of the base station.

SUMMARY

Embodiments of the present application provide an intra-band combiner-divider and a multisystem combining platform, so as to improve receiver sensitivity of a base station.

A first aspect provides an intra-band combiner-divider, including: a first-level duplexer, including a downlink signal output end and an uplink signal input end, where the first-level duplexer is configured to perform separate signal receiving and sending in a downlink direction and perform combined signal receiving and sending in an uplink direction; an intra-band combination unit, where an input end of the intra-band combination unit is connected to the downlink signal output end, and the intra-band combination unit is configured to combine downlink signals in a same band; an intra-band division unit, where an output end of the intra-band division unit is connected to the uplink signal input end, and the intra-band division unit is configured to divide uplink signals in a same band; and a second-level duplexer, including a downlink signal input end and an uplink signal output end, where the downlink signal input end is connected to an output end of the intra-band combination unit, the uplink signal output end is connected to an input end of the intra-band division unit, and the second-level duplexer is configured to perform combined signal receiving and sending in the downlink direction and perform separate signal receiving and sending in the uplink direction.

With reference to the first aspect, in a first implementation manner of the first aspect, the intra-band combination unit is further configured to isolate the downlink signals in the same band according to different carriers.

With reference to the first aspect or any one of the foregoing implementation manners thereof, in another implementation manner of the first aspect, the intra-band combination unit includes: a first isolation module and a first combination module, where the first isolation module is configured to isolate the downlink signals in the same band, where one end of the first isolation module is connected to the downlink signal output end, and the other end is connected to the first combination module; and the first combination module is configured to combine the downlink signals in the same band, where one end of the first combination module is connected to the other end of the first isolation module, and the other end of the first combination module is connected to the downlink signal input end.

With reference to the first aspect or either one of the foregoing implementation manners thereof, in another implementation manner of the first aspect, the intra-band combination unit and the intra-band division unit are integrated on a first circuit card.

With reference to the first aspect or any one of the foregoing implementation manners thereof, in another implementation manner of the first aspect, the first combination module is integrated on a second circuit card, the first isolation module includes at least one isolation submodule, and the at least one isolation submodule is separately integrated on at least one third circuit card.

With reference to the first aspect or any one of the foregoing implementation manners thereof, in another implementation manner of the first aspect, the first combination module includes at least one intra-band combiner, and the at least one intra-band combiner is a surface mount bridge or a narrowband cavity combiner.

With reference to the first aspect or any one of the foregoing implementation manners thereof, in another implementation manner of the first aspect, the intra-band combination unit includes: a second isolation module that is configured to isolate the downlink signals in the same band, and a second combination module and a third combination module that are configured to combine the downlink signals in the same band, where one end of the second combination module is connected to the downlink signal output end, the other end of the second combination module is connected to one end of the second isolation module, the other end of the second isolation module is connected to one end of the third combination module, and the other end of the third combination module is connected to the downlink signal input end.

With reference to the first aspect or any one of the foregoing implementation manners thereof, in another implementation manner of the first aspect, both the second combination module and the third combination module include at least one intra-band combiner, and the intra-band combiner is a surface mount bridge or a narrowband cavity combiner.

With reference to the first aspect or any one of the foregoing implementation manners thereof, in another implementation manner of the first aspect, the intra-band division unit is further configured to isolate the uplink signals in the same band according to different carriers.

With reference to the first aspect or any one of the foregoing implementation manners thereof, in another implementation manner of the first aspect, the first-level duplexer includes at least one narrowband duplexer.

A second aspect provides a multisystem combining platform, including: at least two intra-band combiner-dividers according to the first aspect or any one of the foregoing implementation manners thereof, where different intra-band combiner-dividers in the at least two intra-band combiner-dividers are configured to separately process signals in different bands; and an inter-band combiner-divider, where one end of the inter-band combiner-divider is connected to one end of the second-level duplexer of the at least two intra-band combiner-dividers, and the inter-band combiner-divider is configured to perform, in a downlink direction, combined signal receiving and sending on inter-frequency signals and perform, in an uplink direction, separate signal receiving and sending on inter-frequency signals.

With reference to the second aspect, in an implementation manner of the second aspect, the inter-band combiner-divider includes at least one inter-band combiner and at least one coupler, where one end of the at least one inter-band combiner is connected to one end of the second-level duplexer, and the other end of the at least one inter-band combiner is connected to one end of the at least one coupler.

In the embodiments of the present application, two ends of an intra-band combiner-divider are connected to a first-level duplexer and a second-level duplexer, uplink and downlink signals inside the intra-band combiner-divider are separated by using the first-level duplexer and the second-level duplexer, and then uplink signals in a same band and downlink signals in a same band are separately processed by using an intra-band division unit and an intra-band combination unit, so that an intermodulation effect of a same device that works at multiple carrier signals at the same time is reduced, thereby reducing PIM of a communication system and improving receiver sensitivity of a base station.

BRIEF DESCRIPTION OF DRAWINGS

To describe the technical solutions in the embodiments of the present application more clearly, the following briefly introduces the accompanying drawings required for describing the embodiments of the present application. Apparently, the accompanying drawings in the following description show merely some embodiments of the present application, and a person of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. Apparently, the described embodiments are a part rather than all of the embodiments of the present application. All other embodiments obtained by a person of ordinary skill in the art based on the embodiments of the present application without creative efforts shall fall within the protection scope of the present application.

It should be understood that multisystem signals combined by a multisystem combining platform are not specifically limited in the embodiments of the present application; for example, the system may be a Global System for Mobile Communications (GSM), a Code Division Multiple Access (CDMA) system, a Wideband Code Division Multiple Access (WCDMA) system, a general packet radio service (GPRS), a Long Term Evolution (LTE) system, a Long Term Evolution Advanced (LTE-A) system, and a Universal Mobile Telecommunications System (UMTS), and the like.

Figure 1:
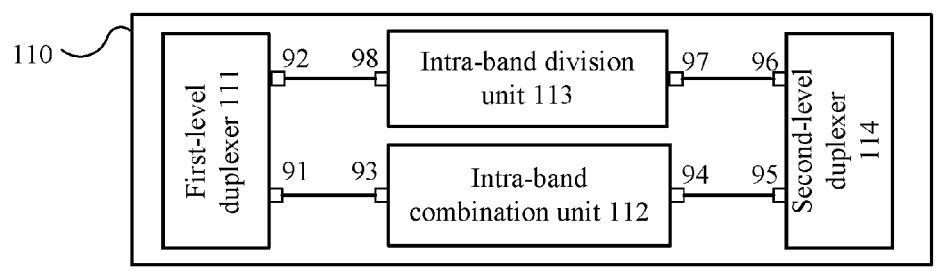
FIG. 1 is a schematic block diagram of an intra-band combiner-divider according to an embodiment of the present application.

FIG. 1 is a schematic block diagram of an intra-band combiner-divider according to an embodiment of the present application. An intra-band combiner-divider 110 in FIG. 1 includes a first-level duplexer 111, an intra-band combination unit 112, an intra-band division unit 113, and a second-level duplexer 114.

The first-level duplexer 111 includes a downlink signal output end 91 and an uplink signal input end 92, and the first-level duplexer 111 is configured to perform, in a downlink direction, separate signal receiving and sending on uplink signals and downlink signals, and perform, in an uplink direction, combined signal receiving and sending on uplink signals and downlink signals.

For the intra-band combination unit 112, an input end 93 of the intra-band combination unit 112 is connected to the downlink signal output end 91 of the first-level duplexer 111; an output end 94 of the intra-band combination unit 112 is connected to a downlink signal input end 95 of the second-level duplexer 114; the intra-band combination unit 112 is configured to combine downlink signals in a same band.

For the intra-band division unit 113, an input end 97 of the intra-band division unit 113 is connected to an uplink signal output end 96 of the second-level duplexer 114; an output end 98 of the intra-band division unit 113 is connected to the uplink signal input end 92 of the first-level duplexer 111; the intra-band division unit 113 is configured to divide uplink signals in a same band.

The second-level duplexer 114 includes the downlink signal input end 95 and the uplink signal output end 96, where the downlink signal input end 95 is connected to the output end 94 of the intra-band combination unit 112; the uplink signal output end 96 is connected to the input end 97 of the intra-band division unit 113; the second-level duplexer 114 is configured to perform, in the downlink direction, combined signal receiving and sending on the uplink signals and the downlink signals, and perform, in the uplink direction, separate signal receiving and sending on the uplink signals and the downlink signals.

In this embodiment of the present application, two ends of an intra-band combiner-divider are connected to a first-level duplexer and a second-level duplexer, uplink and downlink signals inside the intra-band combiner-divider are separated by using the first-level duplexer and the second-level duplexer, and then uplink signals in a same band and downlink signals in a same band are separately processed by using an intra-band division unit and an intra-band combination unit, so that an intermodulation effect of a same device that works at multiple carrier signals at the same time is reduced, thereby reducing PIM of a communication system and improving receiver sensitivity of a base station.

It should be understood that each port in FIG. 1 is merely logical division and may be one or more physical ports actually. For example, in FIG. 2, the downlink signal output end 91 of the first-level duplexer includes four ports: port 2, port 4, port 6, and port 8.

It should be understood that in this embodiment of the present application, the first-level duplexer 111 may include multiple duplexers (for example, the number is four or three and may also be determined according to the number of operators that gain access to the first-level duplexer; if two operators need to gain access to the first-level duplexer, the number can be determined as two), and the second-level duplexer 114 may also include multiple duplexers (for example, the number is two or one). Duplexers in the first-level duplexer 111 and the second-level duplexer 114 may be narrowband duplexers.

It should be understood that the intra-band combination unit 112 may include at least one intra-band combiner, where the intra-band combiner may be an ordinary bridge, a surface mount bridge, or a narrowband cavity combiner, and the specific number of the at least one intra-band combiner may be determined according to the number of downlink signals output by the first-level duplexer 111. For example, when the first-level duplexer 111 outputs four downlink signals, the intra-band combination unit 112 may include three bridges, and the four downlink signals are combined into two downlink signals by using the three bridges. Likewise, when the second-level duplexer 114 outputs two uplink signals, the intra-band division unit 113 may also include three bridges, and the two uplink signals are divided into four uplink signals by using the three bridges.

It should be noted that the downlink direction refers to a transmission direction of a downlink signal in a communication system, where in the downlink direction, the intra-band combiner-divider 110 receives downlink signals sent by an outdoor base station, combines the downlink signals, and then sends a combined downlink signal to an indoor terminal; the uplink direction refers to a transmission direction of an uplink signal in the communication system, where in the uplink direction, the intra-band combiner-divider 110 receives an uplink signal sent by the indoor terminal and sends divided uplink signals to the outdoor base station.

Optionally, as another embodiment, the intra-band combination unit 112 may be further configured to isolate downlink signals in a same band, where the downlink signals include multiple signals that are in a same band but are in different carriers. The downlink signals in the same band are isolated according to different carriers, so that downlink signals that are in a same band but in different carriers are obtained after the isolation. The intra-band combination unit 112 not only includes an intra-band combiner such as a bridge, but also may include an isolator. The first-level duplexer implements separate signal receiving and sending; therefore, it is ensured that an intermodulation product subsequently generated by the isolator does not fall within a receive band of a base station, thereby reducing a subsequent intermodulation requirement between a connection line and a bridge. In addition, a manner of separate signal receiving and sending is used; therefore, PIM inside a POI is reduced, and intra-band isolation of an entire POI system is enhanced.

It should be noted that an arrangement manner in which the intra-band combination unit 112 implements intra-band isolation and intra-band combination is not specifically limited in this embodiment of the present application.

The intra-band combination unit 112 may include: a first isolation module, configured to isolate the downlink signals in the same band, where one end of the first isolation module is connected to the downlink signal output end of the first-level duplexer 111; a first combination module, configured to combine the downlink signals in the same band, where one end of the first combination module is connected to the other end of the first isolation module, and the other end of the first combination module is connected to the downlink signal input end of the second-level duplexer 114.

In this embodiment of the present application, two-level duplexers are introduced into an intra-band combiner-divider, so that the intra-band combiner-divider separately processes uplink and downlink signals; on this basis, intra-band isolation is performed on separated downlink signals by introducing a first isolation module, thereby enhancing intra-band isolation of a communication system.

For example, the first-level duplexer 111 may include four duplexers, where each of the four duplexers has one downlink signal output end, so that four downlink signal output ends exist in total. The first isolation module has four isolators, where input ends of the four isolators are separately connected to the four downlink signal output ends. The first combination module has three bridges (which are a bridge 1, a bridge 2, and a bridge 3), where the bridge 1 and the bridge 2 in the three bridges are located on an input end of the first combination module; the bridge 3 in the three bridges is located on an output end of the first combination module; both the bridge 1 and the bridge 2 may be a bridge with two inlets and one outlet; the bridge 3 may be a bridge with two inlets and two outlets; inside the first combination module, the outlets of the bridge 1 and the bridge 2 are separately connected to the inlets of the bridge 3. Two output ends among output ends of the four isolators are connected to the inlets of the bridge 1, and the other two output ends are connected to the inlets of the bridge 2. Each duplexer in the second-level duplexer 114 has one downlink signal input end, so that two downlink signal input ends exist in total, where the two downlink signal input ends are separately connected to the two outlets of the bridge 3.

Optionally, the intra-band combination unit 112 and the intra-band division unit 113 may be integrated on a first circuit card.

Optionally, the first combination module may be integrated on a second circuit card, the first isolation module may include at least one isolation submodule, and the at least one isolation submodule is separately integrated on at least one third circuit card.

For example, the first isolation module includes four isolators, where in the four isolators, every two isolators are grouped as one isolation submodule, so that two isolation submodules are included in total; each isolation submodule is integrated on one third circuit card, so that two third circuit cards are needed.

Isolators are introduced into an intra-band combination unit, and each isolator is responsible for isolating a downlink signal in a line in which the isolator is located, so that interference, caused by another signal in the intra-band combination unit, to the downlink signal is reduced, thereby enhancing isolation of an intra-band combiner-divider. It should be noted that the first combination module includes at least one intra-band combiner, and the at least one intra-band combiner is a surface mount bridge or a narrowband cavity combiner. For example, the first combination module may include three intra-band combiners, where all the three intra-band combiners may be surface mount bridges or narrowband cavity combiners, and may also be a combination of the foregoing two types of intra-band combiner.

When the narrowband cavity combiner is used to combine intra-frequency signals, in comparison with the bridge, an insertion loss caused when the signals pass through the combiner can be reduced.

The intra-band combination unit 112 may further include a second combination module, a second isolation module, and a third combination module, where one end of the second combination module is connected to the downlink signal output end of the first-level duplexer 111, the other end of the second combination module is connected to one end of the second isolation module, the other end of the second isolation module is connected to one end of the third combination module, and the other end of the third combination module is connected to the downlink signal input end of the second-level duplexer 114.

In this arrangement manner, an intra-band combiner in the second combination module may be configured as a narrowband cavity combiner, and a bridge is still selected for the third combination module. For example, the first-level duplexer 111 outputs four downlink signals to the second combination module; the second combination module may include two narrowband cavity combiners, where the two narrowband cavity combiners receive the four downlink signals and combine the four downlink signals into two signals; the second isolation module includes two isolators, where the two isolators separately isolate two downlink signals output by the second combination module; the third combination module includes one surface mount bridge, where the surface mount bridge receives two downlink signals output by the second isolation module, combines the two downlink signals, and still outputs two downlink signals to the second-level duplexer 114; the second-level duplexer 114 includes two duplexers, where the two duplexers separately receive the two downlink signals output by the second isolation module and then perform combined signal receiving and sending.

It should be noted that the specific arrangement manner of the intra-band combination unit 112 is described in detail in the foregoing, and the intra-band division unit 113 may also use an arrangement manner corresponding to that of the intra-band combination unit 112. The intra-band division unit 113 may include a division module, where a structure of the division module may be the same as that of a combination module in the intra-band combination unit 112 only if the input end and the output end of the first combination module are reversed. For example, the division module may also use a structure of the bridge 3. Differently, in the intra-band division unit 113, the two outlets of the bridge 3 are an input end of the division module and are separately connected to the uplink signal input end of the second-level duplexer 114, and the four inlets of the bridge 1 and the bridge 2 are an output end of the division module and are separately connected to the uplink signal output end of the first-level duplexer 111.

In this embodiment of the present application, two ends of an intra-band combiner-divider are connected to a first-level duplexer and a second-level duplexer, uplink and downlink signals inside the intra-band combiner-divider are separated by using the first-level duplexer and the second-level duplexer, and then uplink signals on different frequencies and downlink signals on different frequencies are separately processed by using an intra-band division unit and an intra-band combination unit, so that an intermodulation effect of a same device that works at multiple carrier signals at the same time is reduced, thereby reducing PIM of a communication system.

Further, the intra-band division unit 113 may further include an isolation module, for example, one isolator is added to each line between the division module and the second-level duplexer.

Isolators are introduced into an intra-band division unit, and each isolator is responsible for isolating an uplink signal in a line in which the isolator is located, so that interference, caused by another signal in the intra-band division unit, to the uplink signal is reduced, thereby enhancing isolation of an intra-band combiner-divider. It should be noted that the intra-band combiner-divider 110 may further include a high-power load and a radiator, where the high-power load is configured to absorb a high-power intra-frequency signal; because a manner of separate signal receiving and sending is used, a POI requirement inside a system is reduced, so that a load with high power and low PIM is not needed.

Figure 2:
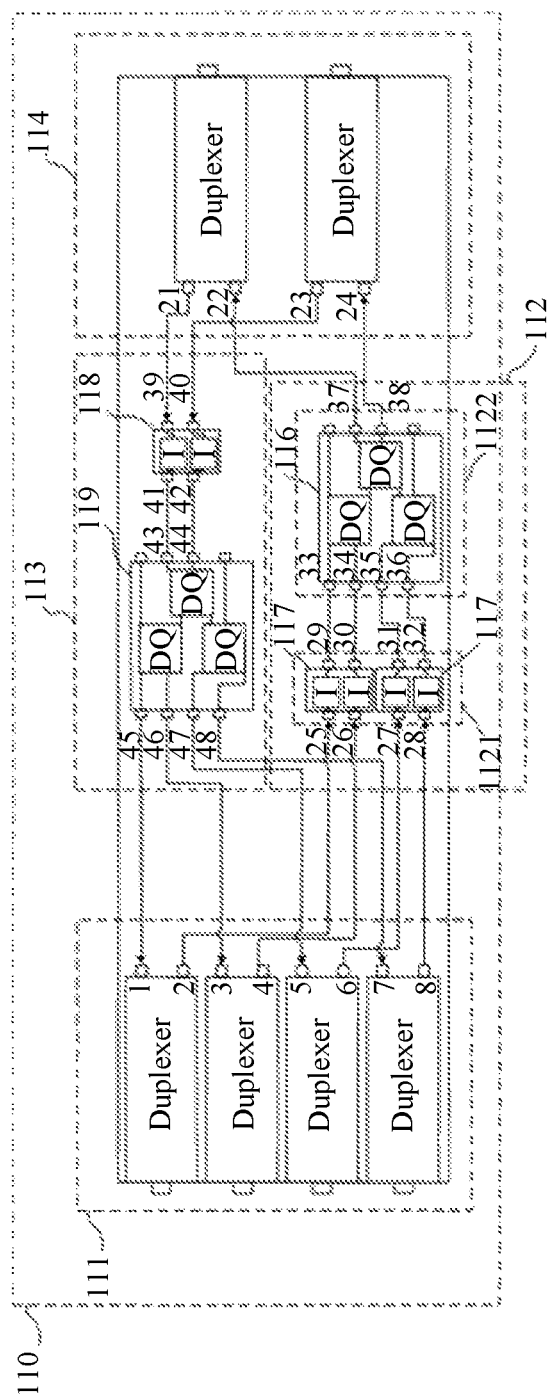
FIG. 2 is a schematic structural diagram of an intra-band combiner-divider according to an embodiment of the present application.
Figure 3:
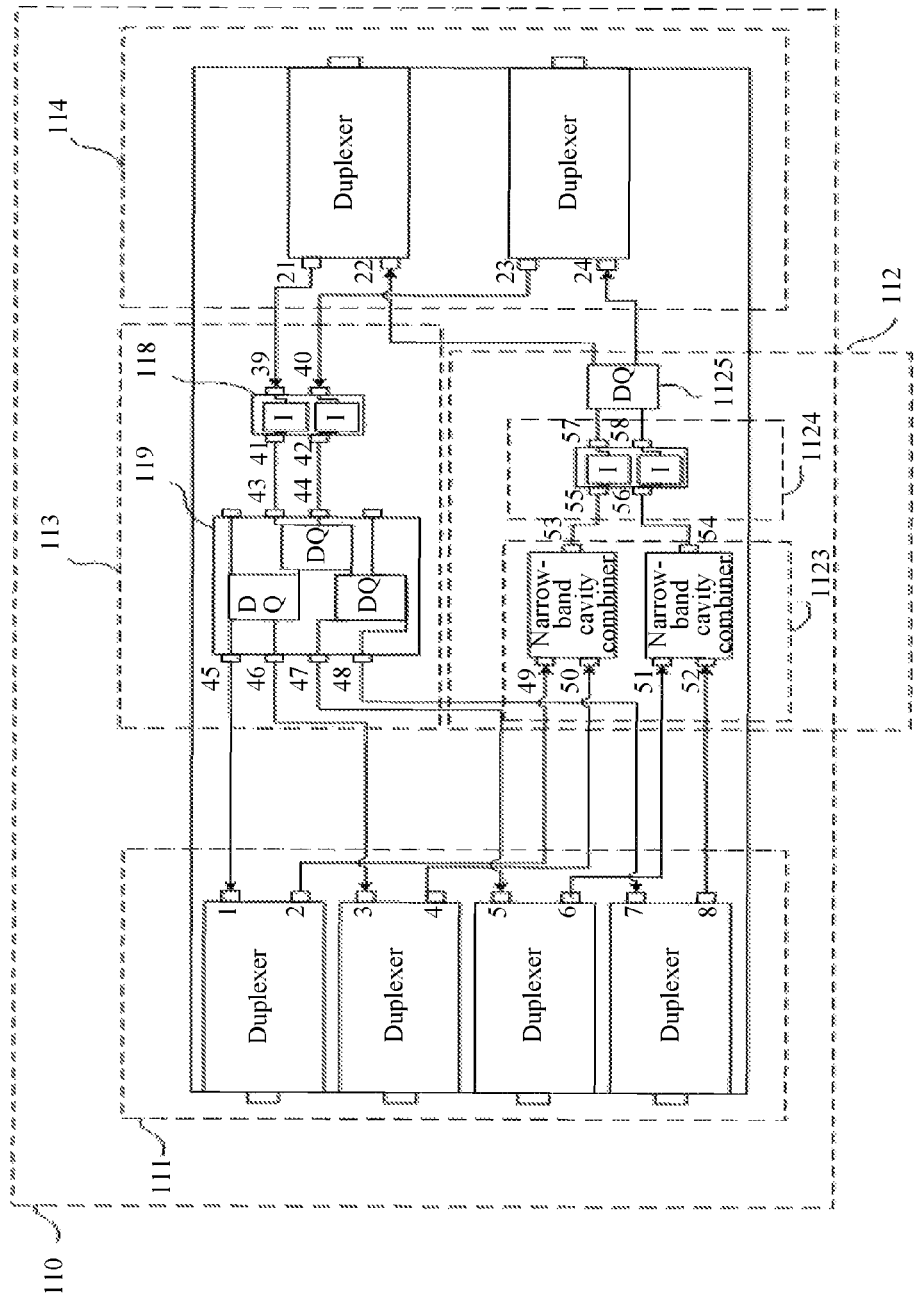
FIG. 3 is a schematic structural diagram of an intra-band combiner-divider according to an embodiment of the present application.

The following further describes the embodiments of the present application in detail with reference to specific examples. It should be noted that examples in FIG. 2 and FIG. 3 are merely intended to help a person skilled in the art understand the embodiments of the present application, instead of limiting the embodiments of the present application to an exemplary specific value or specific scenario. A person skilled in the art apparently can make various equivalent modifications or changes according to the examples in FIG. 2 and FIG. 3, and the modifications or changes also fall within the scope of the embodiments of present application. It should be noted that in FIG. 2, FIG. 3, and FIG. 5, an I module represents an isolator, and a DQ module represents a bridge.

FIG. 2 is a schematic structural diagram of an intra-band combiner-divider according to an embodiment of the present application. In FIG. 2, an intra-band combination unit 112 includes a first isolation module 1121 and a first combination module 1122; the first isolation module 1121 includes four isolators, where every two isolators form one isolation subunit and are separately integrated on one third circuit card 117; the first combination module 1122 includes three bridges (for example, they may be surface mount bridges) and the three bridges are integrated on a second circuit card 116; an intra-band division unit 113 includes an isolation module integrated on a circuit card 118, and a division module integrated on a circuit card 119.

Specifically, in a downlink direction, downlink signal output ends 2, 4, 6, and 8 of a first-level duplexer 111 are respectively connected to terminals 25, 26, 27, and 28 of two third circuit cards 117; the two third circuit cards transmit isolated downlink signals to downlink signal input ends 33, 34, 35, and 36 of the second circuit card 116 by using ports 29, 30, 31, and 32; the second circuit card 116 combines four downlink signals into two signals and separately transmits, by using downlink signal output ends 37 and 38 of the second circuit card 116, two combined downlink signals to downlink signal input ends 22 and 24 of a second-level duplexer 114; the second-level duplexer 114 performs combined signal receiving and sending.

In an uplink direction, uplink signal output ends 21 and 23 of the second-level duplexer 114 separately input two uplink signals to terminals 39 and 40 of the circuit card 118; the circuit card 118 separately isolates the two uplink signals and transmits, by using terminals 41 and 42, isolated uplink signals to uplink signal input ends 43 and 44 of the circuit card 119; the circuit card 119 divides the two input uplink signals to form four uplink signals and transmits, by using terminals 45, 46, 47, and 48, the four uplink signals to uplink signal input ends 1, 3, 5, and 7 of the first-level duplexer 111; the first-level duplexer 111 performs combined signal receiving and sending.

FIG. 3 is a schematic structural diagram of an intra-band combiner-divider according to an embodiment of the present application. An internal structure of an intra-band division unit 113 in the embodiment in FIG. 3 is the same as that of the intra-band division unit 113 in the embodiment in FIG. 2, and a difference lies in that an intra-band combination unit 112 includes a second combination module 1123, a second isolation module 1124, and a third combination module 1125, where the second combination module 1123 includes two narrowband cavity combiners, the second isolation module 1124 includes two isolators, and the third combination module includes one bridge.

Specifically, downlink signal output ends 2, 4, 6, and 8 of a first-level duplexer 111 are respectively connected to terminals 49, 50, 51, and 52 of the second combination module 1123, and separately input four downlink signals to the second combination module; the narrowband cavity combiners in the second combination module 1123 combine the four input downlink signals into two downlink signals, and transmit combined signals to the second isolation module 1124 by using terminals 53 and 54; the second isolation module 1124 separately isolates the two input downlink signals and transmits isolated signals to the third combination module 1125; the third combination module 1125, which is a bridge, combines the isolated signals by using the bridge and generates two downlink signals, and then transmits the two generated downlink signals to downlink signal input ends 22 and 24 of a second-level duplexer 114; the second-level duplexer 114 performs combined signal receiving and sending.

Figure 4:
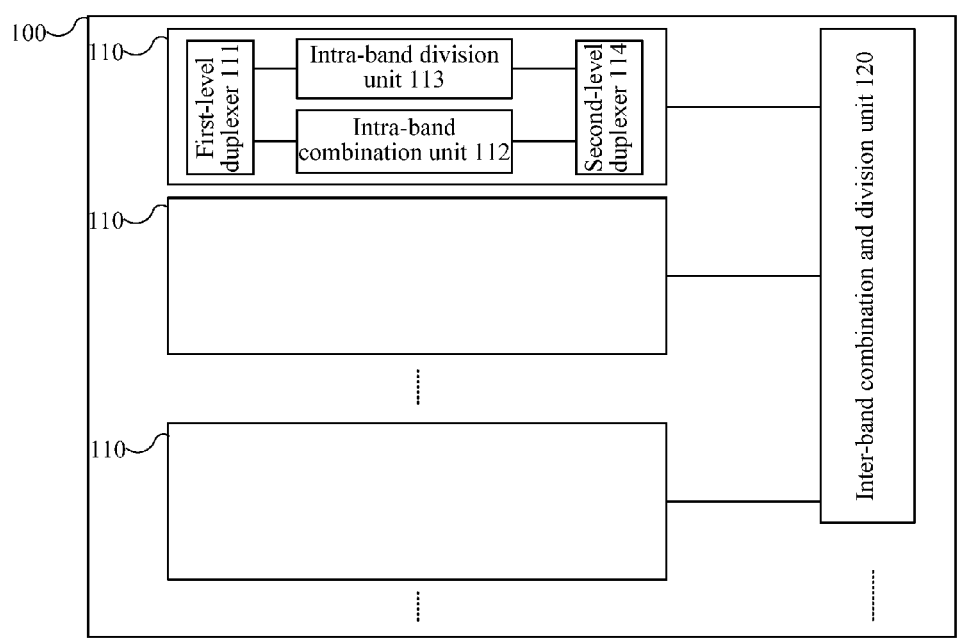
FIG. 4 is a schematic structural diagram of a multisystem combining platform according to an embodiment of the present application.

FIG. 4 is a schematic structural diagram of a multisystem combining platform according to an embodiment of the present application. A multisystem combining platform 100 in FIG. 4 includes at least two intra-band combiner-dividers 110 shown in any one of FIG. 1 to FIG. 3 and an inter-band combiner-divider 120.

For the at least two intra-band combiner-dividers 110, different intra-band combiner-dividers 110 in the at least two intra-band combiner-dividers 110 separately process signals in different bands.

For the inter-band combiner-divider 120, one end of the inter-band combiner-divider 120 is connected to one end of a second-level duplexer of the at least two intra-band combiner-dividers 110, and the inter-band combiner-divider 120 is configured to combine inter-frequency signals in a downlink direction and separate inter-frequency signals in an uplink direction.

In this embodiment of the present application, two ends of an intra-band combiner-divider in a multisystem combining platform are connected to a first-level duplexer and a second-level duplexer, uplink and downlink signals inside the intra-band combiner-divider are separated by using the first-level duplexer and the second-level duplexer, and then uplink signals on different frequencies and downlink signals on different frequencies are separately processed by using an intra-band division unit and an intra-band combination unit, so that an intermodulation effect of a same device that works at multiple carrier signals at the same time is reduced, thereby reducing PIM of a communication system and improving receiver sensitivity of a base station.

It should be understood that in the multisystem combining platform 100, the number of intra-band combiner-dividers 110 and the number of inter-band combiner-dividers 120 are not specifically limited, and a correspondence between the number of intra-band combiner-dividers 110 and the number of inter-band combiner-dividers 120 is not specifically limited in this embodiment of the present application. The number of intra-band combiner-dividers 110 and the number of inter-band combiner-dividers 120 may be adjusted according to the number of types of indoor communication systems, and a ratio of the intra-band combiner-dividers 110 to the inter-band combiner-dividers 120 is selected in consideration of factors such as cabling.

Optionally, the inter-band combiner-divider 120 includes at least one inter-band combiner and at least one coupler, where one end of the at least one inter-band combiner is connected to one end of the second-level duplexer, and the other end of the at least one inter-band combiner is connected to one end of the at least one coupler.

Figure 5:
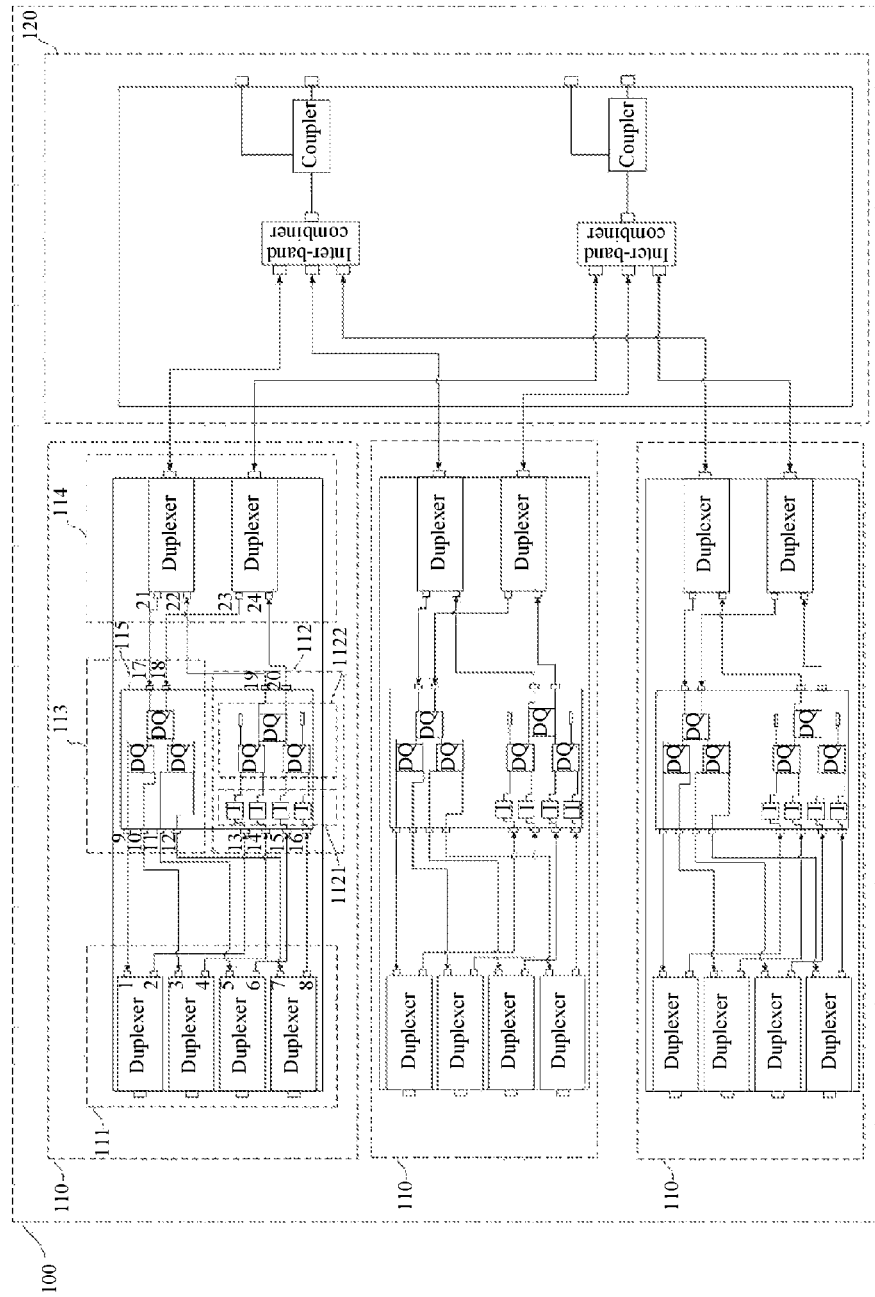
FIG. 5 is a schematic structural diagram of a multisystem combining platform according to an embodiment of the present application.

Specifically, as shown in FIG. 5, in the multisystem combining platform 100, three intra-band combiner-dividers 110 are corresponding to one inter-band combiner-divider 120. The first-level duplexer 111 includes four duplexers, and the second-level duplexer 114 includes two duplexers; an intra-band combination unit 112 includes a first isolation module 1121 and a first combination module 1122, where the first isolation module 1121 includes four isolators, and the first combination module 1122 includes three bridges (DQ) (for example, they may be surface mount bridges); an intra-band division unit 113 includes three bridges (for example, they may be surface mount bridges); the intra-band combination unit 112 and the intra-band division unit 113 are integrated on a first circuit card 115.

In this embodiment of the present application, two ends of an intra-band combiner-divider in a multisystem combining platform are connected to a first-level duplexer and a second-level duplexer, so that the intra-band combiner-divider separately processes uplink and downlink signals, thereby reducing PIM of the multisystem combining platform.

Further, the first-level duplexer implements separate signal receiving and sending; therefore, it is ensured that an intermodulation product subsequently generated by an isolation module does not fall within a receive band of a POI, thereby reducing a subsequent intermodulation requirement between a connection line and a bridge. In addition, a manner of separate signal receiving and sending is used; therefore, PIM inside the POI is reduced, and intra-band isolation of an entire system is enhanced.

In a downlink direction, downlink signal output ends 2, 4, 6, and 8 of the first-level duplexer 111 respectively transmit downlink intra-frequency signals to downlink signal input ends 13, 14, 15, and 16 of the first circuit card 115; then the first isolation module 1121 on the first circuit card 115 isolates the downlink intra-frequency signals and inputs the isolated downlink signals to the first combination module 1122 on the first circuit card 115 for combination; the intra-band combination unit 112 combines the four downlink signals into two signals and outputs combined signals by using downlink signal output ends 19 and 20 of the first circuit card 115; the first circuit card 115 separately transmits the two signals to downlink signal input ends 22 and 24 of the second-level duplexer 114; the second-level duplexer 114 combines uplink and downlink signals and transmits combined uplink and downlink signals to the inter-band combiner-divider 120; the inter-band combiner-divider 120 combines signals on different frequencies and sends combined signals to an indoor terminal.

In an uplink direction, the second-level duplexer 114 performs separate signal receiving and sending on an intra-frequency signal received from the inter-band combiner-divider 120; then uplink signals are transmitted to uplink signal input ends 17 and 18 of the first circuit card 115 by using uplink signal output ends 21 and 23 of the second-level duplexer 114; the intra-band division unit 113 on the first circuit card 115 divides the two uplink signals to obtain four uplink signals, and outputs, by using uplink signal output ends 9, 10, 11, and 12 of a first circuit card 115, the four uplink signals to uplink signal input ends 1, 3, 5, and 7 of the first-level duplexer 111; the first-level duplexer 111 performs combined signal receiving and sending on the input signals.

It should be noted that the multisystem combining platform 100 in FIG. 4 uses a modular design; therefore, in practice, a device structure of a multisystem combining platform may be obtained by stacking the multisystem combining platform 100 in FIG. 4.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present application essentially, or the part contributing to the prior art, or a part of the technical solutions may be implemented in a form of a software product. The software product is stored in a storage medium, and includes several instructions for instructing a computer device (which may be a personal computer, a server, or a network device) to perform all or a part of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. An intra-band combiner-divider, comprising:
a first-level duplexer, comprising a downlink signal output end and an uplink signal input end, wherein the first-level duplexer is configured to perform separate signal receiving and sending in a downlink direction and perform combined signal receiving and sending in an uplink direction;
an intra-band combination unit, wherein an input end of the intra-band combination unit is connected to the downlink signal output end, and the intra-band combination unit is configured to combine downlink signals in a same band;
an intra-band division unit, wherein an output end of the intra-band division unit is connected to the uplink signal input end, and the intra-band division unit is configured to divide uplink signals in a same band; and
a second-level duplexer, comprising a downlink signal input end and an uplink signal output end, wherein the downlink signal input end is connected to an output end of the intra-band combination unit, the uplink signal output end is connected to an input end of the intra-band division unit, and the second-level duplexer is configured to perform combined signal receiving and sending in the downlink direction and perform separate signal receiving and sending in the uplink direction.

2. The intra-band combiner-divider according to claim 1, wherein the intra-band combination unit is further configured to isolate the downlink signals in the same band according to different carriers.

3. The intra-band combiner-divider according to claim 2, wherein the intra-band combination unit comprises: a first isolation module and a first combination module, wherein:
the first isolation module is configured to isolate the downlink signals in the same band, wherein one end of the first isolation module is connected to the downlink signal output end, and the other end is connected to the first combination module; and
the first combination module is configured to combine the downlink signals in the same band, wherein one end of the first combination module is connected to the other end of the first isolation module, and the other end of the first combination module is connected to the downlink signal input end.

4. The intra-band combiner-divider according to claim 1, wherein the intra-band combination unit and the intra-band division unit are integrated on a first circuit card.

5. The intra-band combiner-divider according to claim 3, wherein the first combination module is integrated on a second circuit card, the first isolation module comprises at least one isolation submodule, and the at least one isolation submodule is separately integrated on at least one third circuit card.

6. The intra-band combiner-divider according to claim 3, wherein the first combination module comprises at least one intra-band combiner, and the at least one intra-band combiner is a surface mount bridge or a narrowband cavity combiner.

7. The intra-band combiner-divider according to claim 2, wherein the intra-band combination unit comprises:
a second isolation module that is configured to isolate the downlink signals in the same band, and a second combination module and a third combination module that are configured to combine the downlink signals in the same band, wherein:
one end of the second combination module is connected to the downlink signal output end, the other end of the second combination module is connected to one end of the second isolation module, the other end of the second isolation module is connected to one end of the third combination module, and the other end of the third combination module is connected to the downlink signal input end.

8. The intra-band combiner-divider according to claim 7, wherein both the second combination module and the third combination module comprise at least one intra-band combiner, and the intra-band combiner is a surface mount bridge or a narrowband cavity combiner.

9. The intra-band combiner-divider according to claim 1, wherein the intra-band division unit is further configured to isolate the uplink signals in the same band according to different carriers.

10. The intra-band combiner-divider according to claim 1, wherein the first-level duplexer comprises at least one narrowband duplexer.

11. A multisystem combining platform, comprising:
at least two intra-band combiner-dividers, each of the least two intra-band combiner-divider comprises:
a first-level duplexer, comprising a downlink signal output end and an uplink signal input end, wherein the first-level duplexer is configured to perform separate signal receiving and sending in a downlink direction and perform combined signal receiving and sending in an uplink direction;
an intra-band combination unit, wherein an input end of the intra-band combination unit is connected to the downlink signal output end, and the intra-band combination unit is configured to combine downlink signals in a same band;
an intra-band division unit, wherein an output end of the intra-band division unit is connected to the uplink signal input end, and the intra-band division unit is configured to divide uplink signals in a same band; and
a second-level duplexer, comprising a downlink signal input end and an uplink signal output end, wherein the downlink signal input end is connected to an output end of the intra-band combination unit, the uplink signal output end is connected to an input end of the intra-band division unit, and the second-level duplexer is configured to perform combined signal receiving and sending in the downlink direction and perform separate signal receiving and sending in the uplink direction;
wherein different intra-band combiner-dividers in the at least two intra-band combiner-dividers are configured to separately process signals in different bands; and
an inter-band combiner-divider, wherein one end of the inter-band combiner-divider is connected to one end of the second-level duplexer of the at least two intra-band combiner-dividers, and the inter-band combiner-divider is configured to perform, in a downlink direction, combined signal receiving and sending on inter-frequency signals and perform, in an uplink direction, separate signal receiving and sending on inter-frequency signals.

12. The multisystem combining platform according to claim 11, wherein the inter-band combiner-divider comprises at least one inter-band combiner and at least one coupler, wherein:
one end of the at least one inter-band combiner is connected to one end of the second-level duplexer, and the other end of the at least one inter-band combiner is connected to one end of the at least one coupler.

* * * * *